(12) United States Patent
Tso et al.

(10) Patent No.: US 7,588,946 B2
(45) Date of Patent: Sep. 15, 2009

(54) CONTROLLING SYSTEM FOR GATE FORMATION OF SEMICONDUCTOR DEVICES

(75) Inventors: Chia-Tsung Tso, Hsin-Chu (TW); Jiun-Hong Lai, Hsin-Chu (TW); Mei-Jen Wu, Hsin-Chu (TW); Li Te Hsu, Shanhua Township, Tainan County (TW); Pin Chia Su, Tainan (TW); Po-Zen Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 11/188,324

(22) Filed: Jul. 25, 2005

(65) Prior Publication Data

US 2007/0020777 A1    Jan. 25, 2007

(51) Int. Cl.
*H01L 21/00* (2006.01)
(52) U.S. Cl. .................. 438/9; 438/16; 257/E21.528
(58) Field of Classification Search ............ 438/5, 438/7, 12, 14, 16, 125, 9; 257/E21.528
See application file for complete search history.

(56) References Cited

U.S. PATENT DOCUMENTS

| | | | |
|---|---|---|---|
| 3,904,449 A * | 9/1975 | DiLorenzo et al. .......... 438/380 |
| 4,840,701 A * | 6/1989 | Stern .......................... 438/747 |
| 4,883,505 A * | 11/1989 | Lucero ........................ 95/154 |
| 5,091,049 A * | 2/1992 | Campbell et al. ............ 216/37 |
| 5,292,717 A * | 3/1994 | Roas .......................... 505/401 |
| 5,726,479 A * | 3/1998 | Matsumoto et al. ......... 257/412 |
| 6,486,492 B1 | 11/2002 | Su |
| 6,657,716 B1 * | 12/2003 | Lensing et al. ........... 356/237.4 |
| 6,657,717 B2 * | 12/2003 | Cadell et al. ............. 356/243.1 |
| 2002/0107599 A1 * | 8/2002 | Patel et al. .................... 700/99 |

* cited by examiner

*Primary Examiner*—Matthew Smith
*Assistant Examiner*—Jarrett J Stark
(74) *Attorney, Agent, or Firm*—Slater & Matsil, L.L.P.

(57) ABSTRACT

A method of controlling gate formation of semiconductor devices includes determining the correlation between the step heights of isolation structures and the over-etching time by measuring step heights of isolation structures, determining an over-etching time based on the step heights, and etching gates using the over-etching time. The method may include an after-etching-inspection to measure the gate profile and fine-tune the gate formation control. Within-wafer uniformity can also be improved by measuring the step height uniformity on a wafer and adjusting gate formation processes.

20 Claims, 8 Drawing Sheets

CONTROLLING SYSTEM FOR GATE FORMATION OF SEMICONDUCTOR DEVICES

TECHNICAL FIELD

This invention relates generally to manufacturing processes of semiconductor devices, and more particularly to gate formation control of semiconductor devices.

BACKGROUND

Current demands for high density and performance associated with ultra large-scale integrated circuits require submicron features, increased transistor and circuit speeds, and improved reliability. Such demands require formation of device features with high precision and uniformity, which in turn necessitates careful process monitoring, including frequent and detailed inspections of the devices while they are still in the form of semiconductor wafers.

As design rules shrink and process windows (i.e., the margins for error in processing) become smaller, inspection and measurement of surface features' critical dimensions (CD), defined as the smallest width of a line or the smallest space between two lines permitted in the fabrication of the device, as well as their cross-sectional shape ("profile") are becoming increasingly important. Deviations of a feature's critical dimension and profile from design dimensions may adversely affect the performance of the finished semiconductor device. Furthermore, the measurement of a feature's critical dimension and profile may indicate processing problems, such as stepper defocusing or photo-resist loss due to over-exposure.

Thus, the critical dimension and profile values, especially gate length and gate profile, and their variation from design dimensions, are important indicators of the accuracy and stability of the photo-resist and etch processes. Most of the prior art concentrate efforts on the control of critical dimension, and fewer target gate profile control. MOS device drive current is sensitive to gate critical dimension and gate profile, however, and hence stability of controlling gage formation contributes to overall chip performance improvement.

Although equipment is available for measuring device gate critical dimensions and profiles, such equipment generally does not provide immediate feedback to the photolithography process to reduce variations, and the results of conventional inspections are not typically used to adjust subsequent etch processing. Furthermore, due to process variations, gate critical dimension and profile may be affected by factors unknown to designers, making it difficult to have a universal setting for process control.

There exists a need, therefore, for a simple, cost-effective methodology and system for gate formation control without a significant reduction in production throughput.

SUMMARY OF THE INVENTION

In accordance with one aspect of the present invention, there exists a correlation between the step heights of the isolations and the gate profiles. Adjusting etching settings such as over-etching time can control gate profiles. Therefore, by measuring step heights and determining suitable etching settings, a desired gate critical dimension and profile can be achieved. A method of controlling gate formation of semiconductor devices includes determining the correlation between step height and over-etching time, measuring a step height of an isolation structure, such as a shallow trench isolation, determining an over-etching time based on the step height, and etching a gate using the over-etching time. The method may further include an after-etching-inspection to measure the gate critical dimension and profile and fine-tune the gate formation control.

In accordance with another aspect of the present invention, a preferred embodiment of the present invention includes feeding step heights of isolations into the formation of a mask layer that is used for etching and over-etching the gate. The mask layer includes a photo resist and/or hard mask. Optimal trimming time is determined by using step heights of isolations, and a critical dimension and profile of the photo resist and/or the hard mask obtained during after-development-inspection.

In accordance with another aspect of the present invention, a preferred embodiment of the present invention includes controlling within-wafer non-uniformity of gate critical dimension and profile. By measuring non-uniformity of the step heights, subsequent processes can be adjusted to compensate for the effects of such non-uniformity, so that the gate critical dimensions and profiles across a wafer are more uniform. The non-uniformity data of photo resists and gates can also be obtained through after-development-inspection and after-etching-inspection, respectively, and etching processes can be adjusted correspondingly.

In accordance with yet another aspect of the present invention, a gate formation control system includes a device dimension measuring system, a determination unit, and an etching system for forming a gate. The dimension measuring system measures dimensions such as the step heights of isolations and critical dimensions and profiles of mask layers (photo resists and/or hard masks). The measured data is then provided to the determination unit to adjust etching time, over-etching time and trimming time. Within-wafer non-uniformity can also be provided to the determination unit to adjust etching processes.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
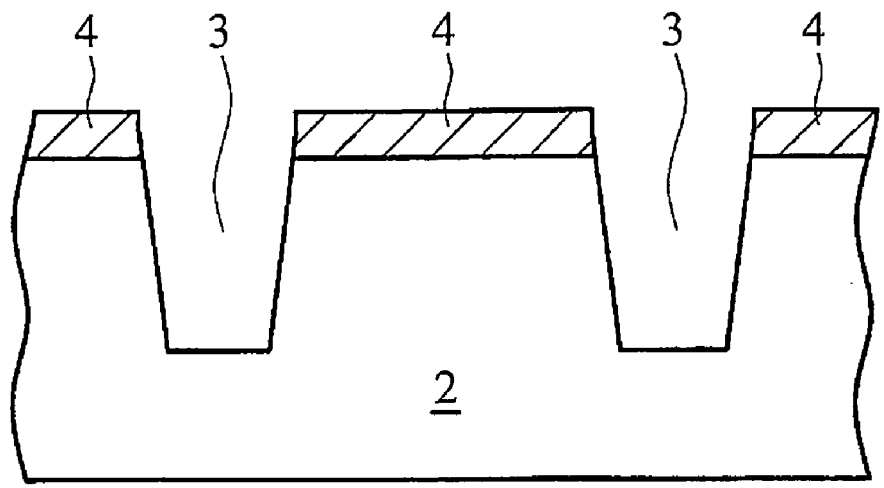
FIGS. 1 through 4 are cross-sectional views of intermediate stages in the manufacture of a typical MOS transistor embodiment.
Figure 2:
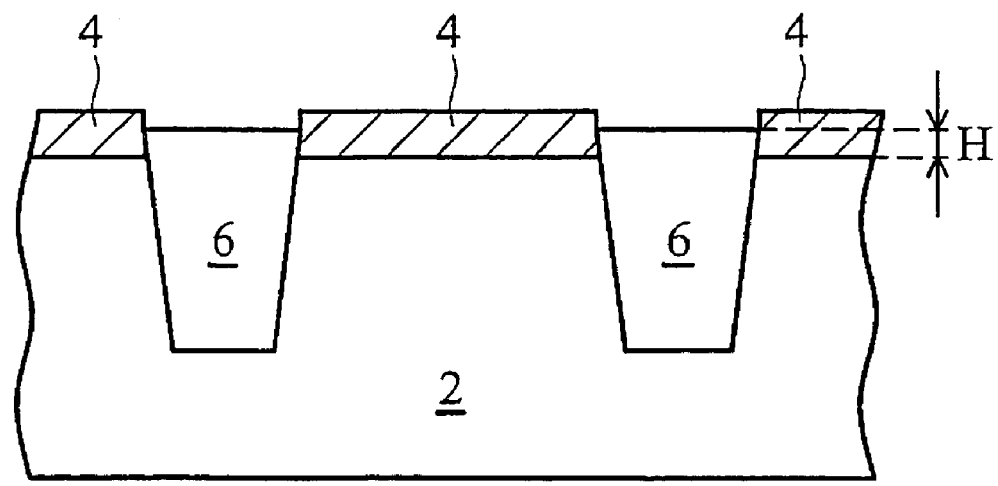

FIGS. 1 through 4 illustrate a typical MOS device and its formation, including the formation of STIs 6. A mask layer 4 is formed on an active region 2. In the preferred embodiment, mask layer 4 is formed of silicon nitride using low-pressure chemical vapor deposition (LPCVD). In other embodiments, mask layer 4 is formed by thermal nitridation of silicon, plasma enhanced chemical vapor deposition (PECVD) or plasma anodic nitridation using nitrogen-hydrogen. Trenches 3 are anisotropically etched through mask layer 4, or silicon nitride 4, into the active region 2. The trenches 3 are then filled, preferably using high-density plasma (HDP), and the filling material is preferably silicon oxide. Other materials such as silicon oxynitride may also be used. A chemical mechanical polish (CMP) is performed to remove excess HDP material and a structure as shown in FIG. 2 is formed. The remaining portion of HDP material forms shallow-trench-isolations (STI) 6. The mask layer 4 is then removed.

Due to design considerations and process variations, the step height H of the STI 6, which is the height difference between the top surface of an STI 6 and its neighboring active region 2, may deviate from wafer to wafer, and even from chip to chip. Step height H may have a positive value, indicating that the STI 6 is higher than the active region 2, or it may have a negative value, indicating that the STI 6 is lower than the active region 2.

Figure 3A:
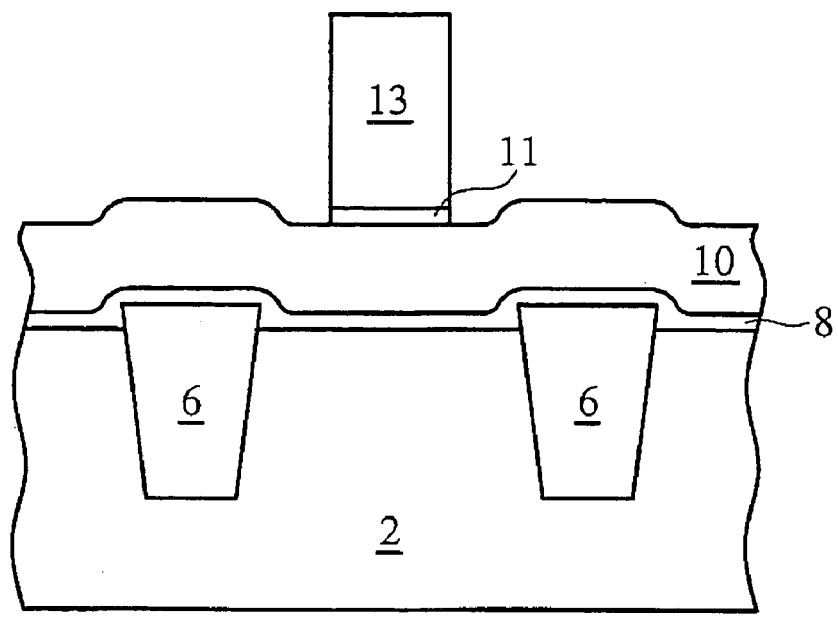
Figure 3B:
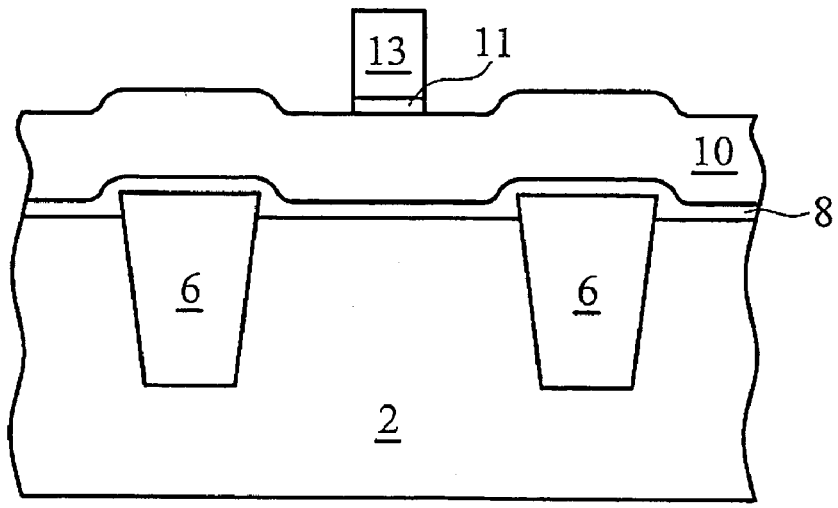
Figure 3C:
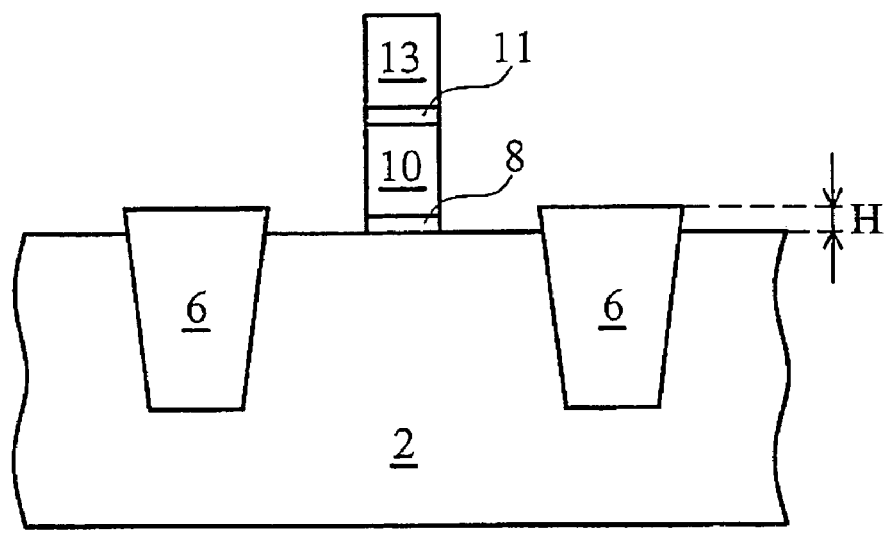
Figure 4:
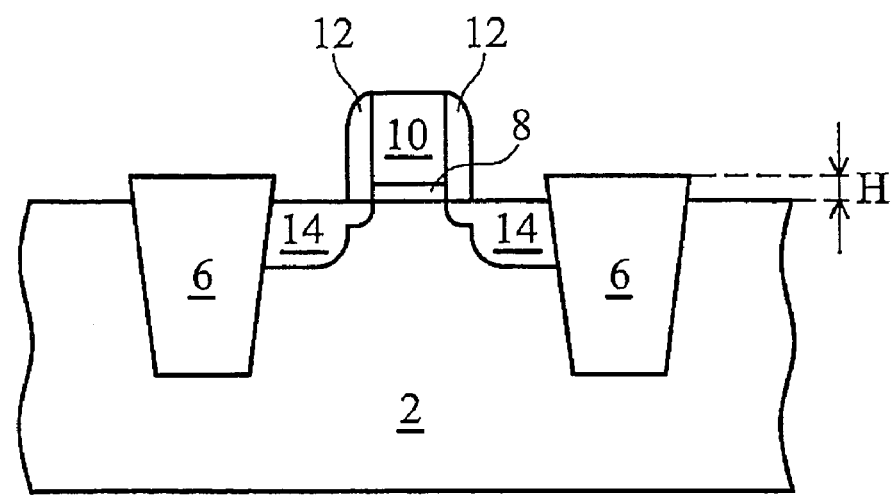

Gate dielectric 8 and gate electrode 10 are then formed, as illustrated in FIGS. 3A, 3B and 3C. FIG. 3A illustrates a gate dielectric layer 8 formed on the active region 2, followed by a gate electrode layer 10. Optionally, a hard mask layer is formed over the gate dielectric layer 8, and then a photo resist layer is formed over the hard mask layer. The hard mask layer and photo resist layer are then patterned to form hard mask 11 and photo resist 13, respectively. In FIG. 3B, the hard mask 11 and photo resist 13 are trimmed from the top and sides and the sizes of the remaining portions are determined by a trimming time. The gate dielectric layer 8 and gate electrode layer 10 are then patterned to form gate dielectric 8 and gate electrode 10, respectively, as illustrated in FIG. 3C. Gate dielectric 8 may comprise $SiO_2$, oxynitride, nitride and high-k materials. Gate electrode 10 is preferably polysilicon, although it may be formed of metal or a compound structure of dielectric/metal/semiconductor. Over-etching can be performed to shape the gate profile. The over-etching referred to in the description may be a separate process step performed after the etching, or an integrated portion of the etching to form the gate electrode. Spacers 12 and source/drain 14 are then formed after the removal of the hard mask 11 and photo resist 13. The formation of these components is well known in the art and thus is not repeated. The resulting structure is shown in FIG. 4.

Figure 5A:
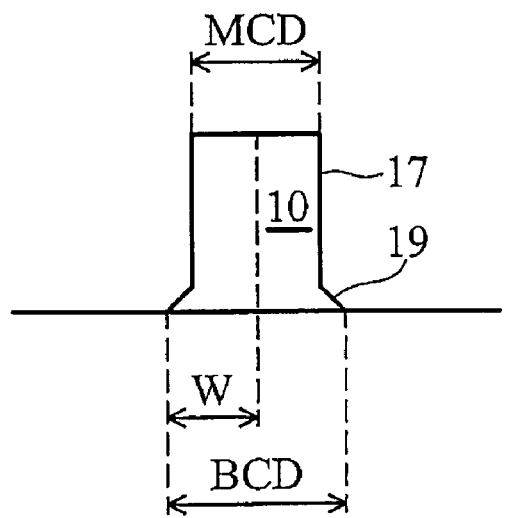
FIGS. 5A, 5B and 5C illustrate typical gate profiles.
Figure 5B:
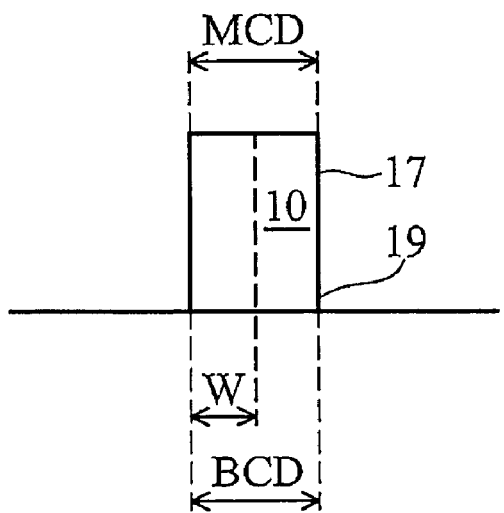
Figure 5C:
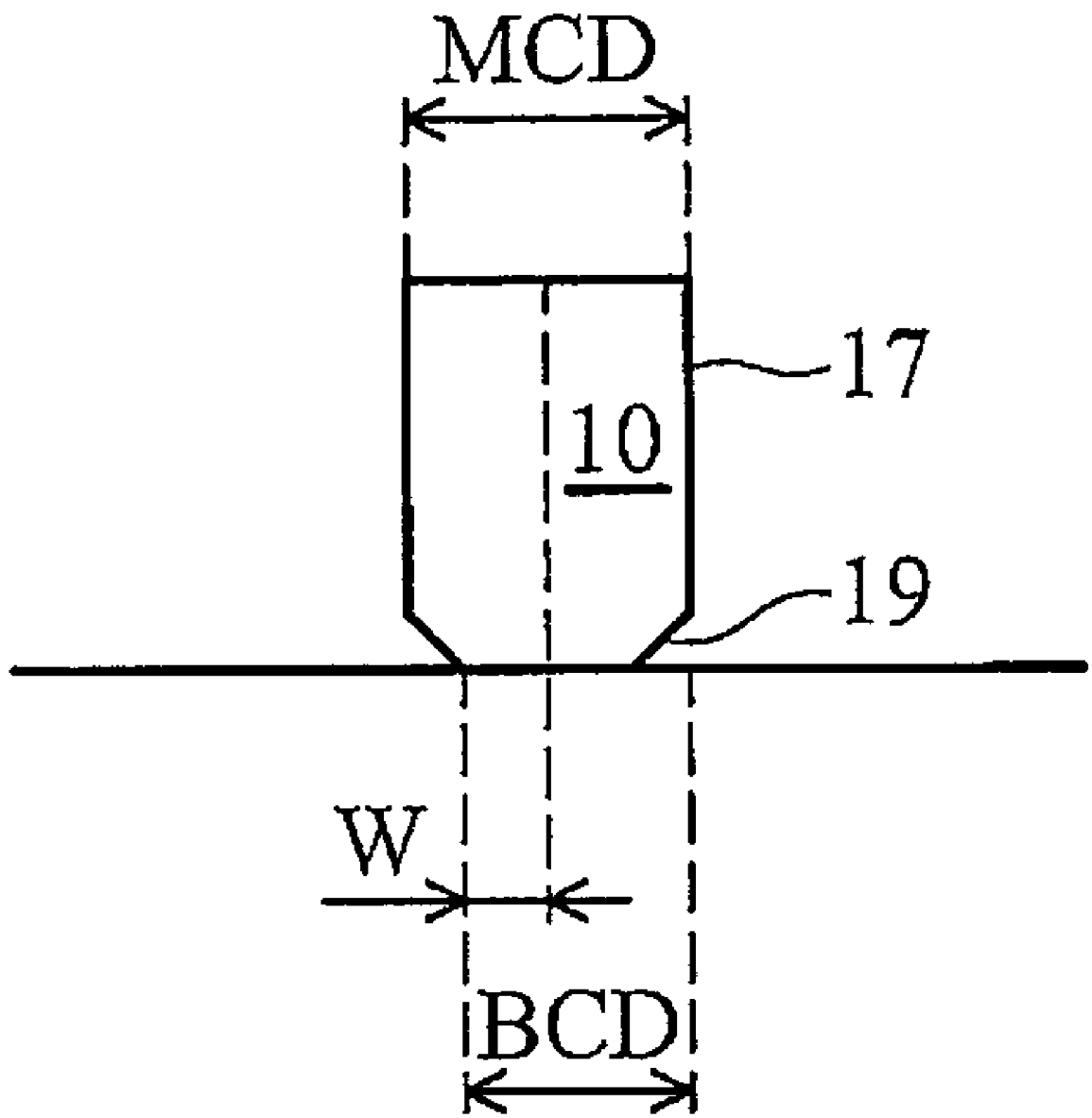

FIGS. 5A, 5B and 5C illustrate three gates with different profiles. FIG. 5A illustrates a gate profile with footing, where the bottom portion 19 of the gate 10 has a greater width than the top portion 17. FIG. 5B illustrates a standard gate profile, where the bottom portion 19 of the gate 10 has substantially the same width as the top portion 17. FIG. 5C illustrates a reduced-foot gate profile, where the bottom portion 19 of the gate 10 is narrower than the top portion 17. The standard profile illustrated in FIG. 5B is typically preferred.

Figure 6:
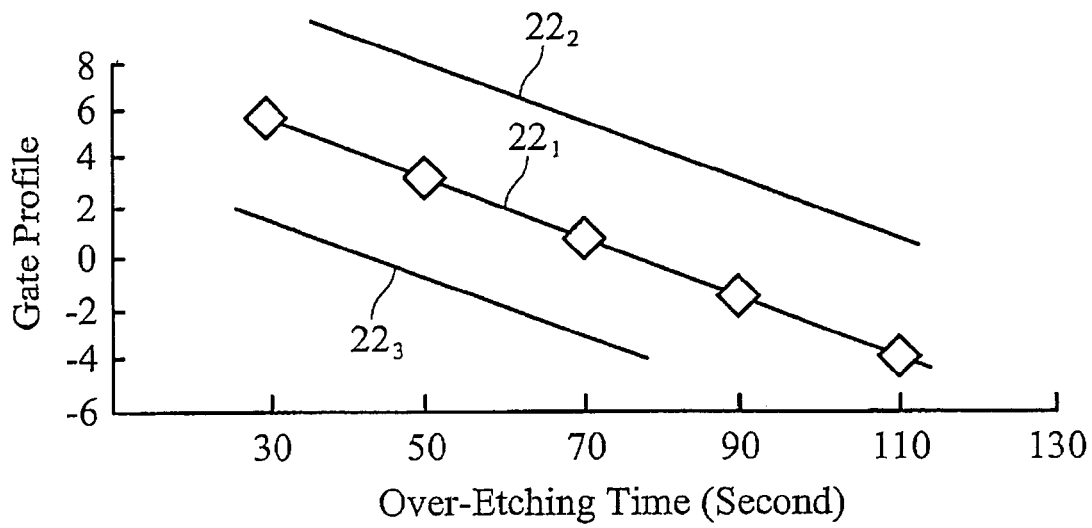
FIG. 6 illustrates gate profile as a function of the over-etching time.

It is known that etching settings affect gate profiles. Particularly, it is known that there is a correlation between the over-etching time of the gate 10 and the gate profile. FIG. 6 illustrates the gate profile as a function of the over-etching time. Referring to FIG. 5, a typical poly gate comprises a foot portion 19 and a top portion 17. The middle part of the top portion 17 has a width of middle critical dimension (MCD), and the bottom of the foot portion 19 has a width of bottom critical dimension (BCD). Referring back to FIG. 6, the Y-axis shows quantified gate profile equals (BCD-MCD)/2, although the gate profile can be defined differently using the (BCD-MCD). The X-axis shows the over-etching time in seconds. A positive gate profile value indicates a footing profile, such as shown in FIG. 5A. A negative gate profile value indicates a reduced profile, such as shown in FIG. 5C. A standard profile, as shown in FIG. 5B, has a gate profile value of zero.

The relationship of the gate profile and over-etching time is represented by line $22_1$. It shows that if less over-etching time is used, the gate profile has footing effect. When over-etching time increases, the width W of the bottom portion reduces. Further increasing over-etching time, the gate profile becomes reduced. In the example shown in FIG. 6, the reduction of width W on each side of the gate bottom portion is substantially proportional to the over-etching time. Line $22_1$ is obtained from sample devices having the same step height H. If samples with different step heights are measured, more lines can be drawn. If samples with a step height greater than H are measured, a line $22_2$ that is above the line $22_1$ will be obtained. Conversely, if samples with a step height less than H are measured, a line $22_3$ that is below the line $22_1$ will be obtained. Some sample devices having polysilicon gates have shown that with about every 10 second increment of over-etching time, the bottom width W reduces about 0.25 nm on each side. It is to be noted that in the example shown in FIG. 6, the X-axis represents over-etching time, which is the etching time above a base etching time, where the base etching time can be defined by the designer. However, total etching time can also be used for correlation.

Figure 7:
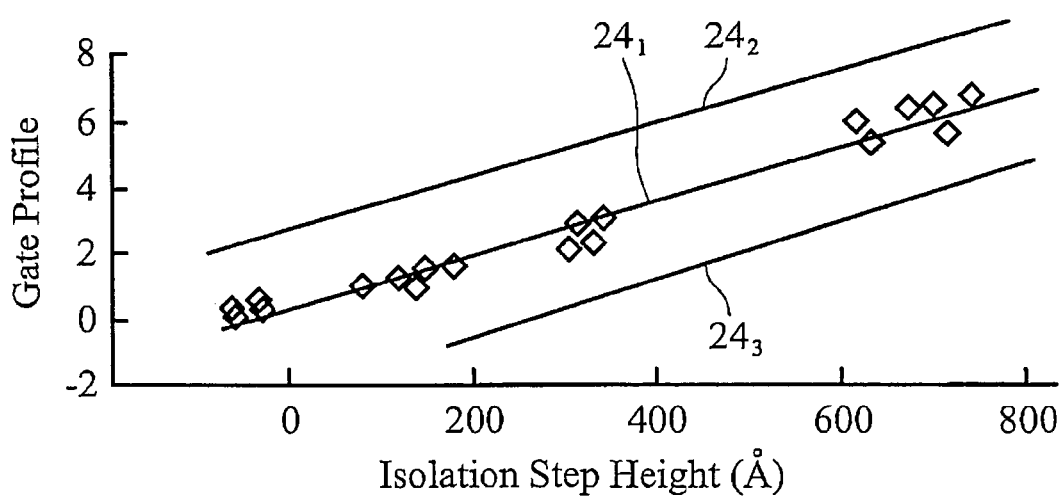
FIG. 7 illustrates gate profile as a function of the step height.

It has also been found that there is a correlation between step height of the STI 6 and gate profile. FIG. 7 illustrates an example of the gate profile as a function of the STI step height. The X-axis shows the step height in angstroms, and the Y-axis shows the gate profile. The relationship of the gate profile and the step height of the STI is represented by lines $24_1$, $24_2$ and $24_3$, which indicate that the gate profile value increases when the step height of the STIs increases. Line $24_1$ is obtained from sample devices formed with the same over-etching time T. If different over-etching times are used, more lines can be drawn. If an over-etching time less than T is used, a line $24_2$ that is above line $24_1$ will be obtained. Conversely, if an over-etching time greater than T is used, a line $24_3$ that is below line $24_1$ will be obtained. For sample devices shown in FIG. 7, the width W on each side of the bottom portion of a gate is substantially proportional to the step height of the STI. Some sample devices having polysilicon gates have shown that when the STI step height increases about 100 Å, the width W of the bottom portion of the gate increases about 1.5 nm.

In FIGS. 6 and 7, the correlation is shown in the form of graphs. The correlation can also be represented in other forms such as lookup tables and equations. The correlation is preferably pre-measured and derived using a set of sample devices. By measuring the step height of the STI 6, the gate profile can be predicted. If the predicted profile deviates from standard profile, or desired profile, over-etching time can be adjusted to correct the deviation. For example, if an STI on a wafer has a step height of 400 Å, it can be predicted from FIG. 7 that the corresponding gate profile will be about 3, which means the bottom portion of the gate will have a greater width. From FIG. 6, a gate profile of 3 corresponds to an over-etching time of about 50 seconds, and a gate profile of 0 corresponds to an over-etching time of about 75 seconds. Therefore, an extra 25 seconds of over-etching time can correct the gate profile back to the standard profile.

Figure 8:
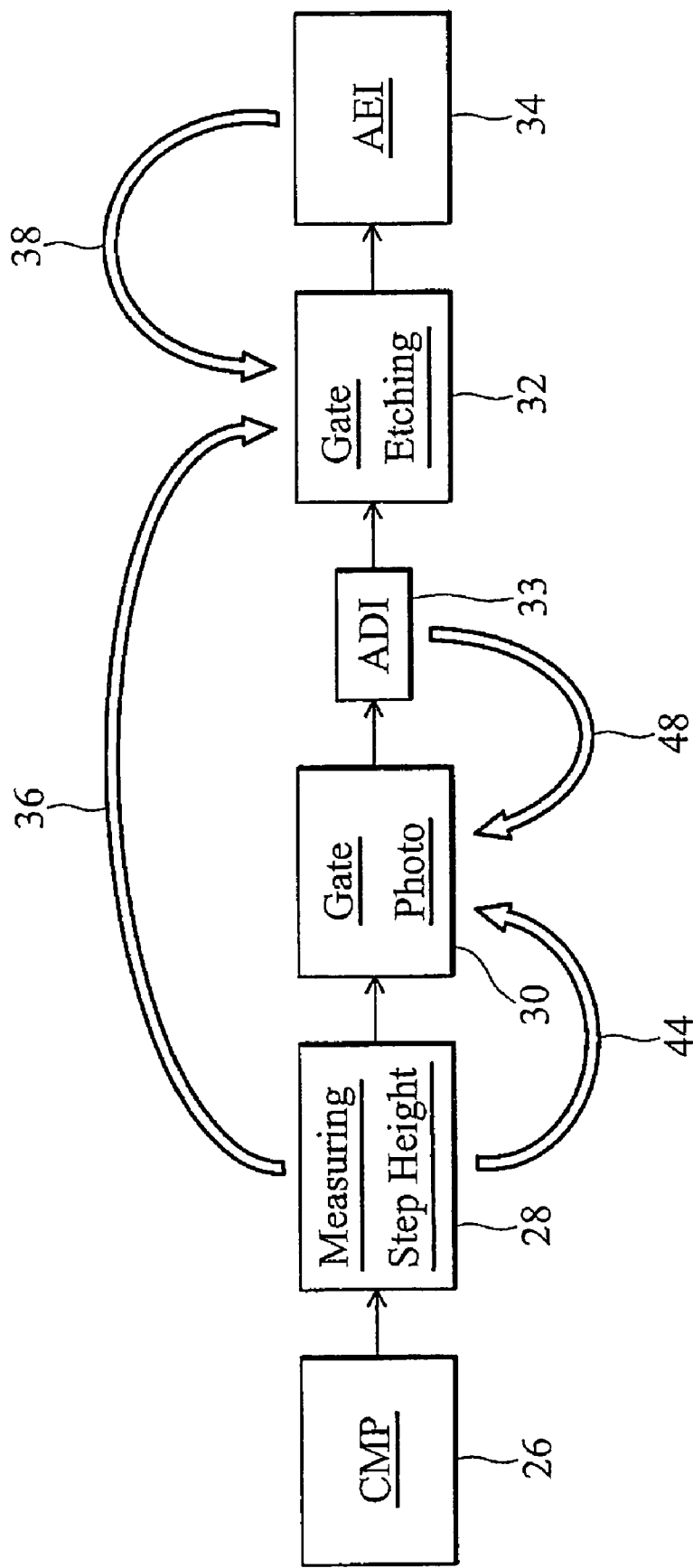
FIG. 8 illustrates a schematic workflow of a gate formation control system.

FIG. 8 illustrates a schematic workflow of a preferred embodiment of the present invention. The gate formation is controlled by a gate formation control system, which includes three sub-systems, namely a device dimension measuring system, a determination unit and an etching system. The function of each block in FIG. 8 is briefly introduced and details are discussed in subsequent paragraphs. After a CMP process (block 26) forming the STI, the STI step height is measured (block 28). Gate photolithography is performed (block 30) to form a mask layer for patterning gates. Gates are then etched/over-etched. An after-development-inspection (ADI) (block 33) is performed to measure dimensions of the mask layer, such as photo resists and hard masks. Step height data gathered in step 28 is fed forward (arrow 36) to the gate-etching step (block 32) in order to determine etching settings such as over-etching time (or etching time). An after-etching-inspection (AEI) (block 34) is then performed to measure the gate critical dimension and gate profile. The gate critical dimension and profile values obtained from the AEI can also be fed back to fine-tune the gate formation control system (arrow 38). The gate formation control system can be further fine-tuned by modifying the trimming time for forming the photo resist and/or hard mask. The photo resist and/or hard mask is also referred to as a mask layer. Similarly, the step height data can be fed forward (arrow 44) and after-development-inspection data can be fed back (arrow 48) to determine trimming time. It is to be noted that when feeding back is involved, the over-etching time or trimming time will affect subsequent wafers, while when feeding forward is involved, both the currently processed wafer and subsequent wafers are affected.

In block 28, the step height can be measured by equipment such as spectra critical dimension (SCD) equipment, such as FX-100 manufactured by KLA. SCD equipment is commonly used in device dimension measuring systems. Such equipment can measure step heights in a wafer without damaging the wafer. The step height is stored, retrieved, and forwarded to the etching system. Other equipment such as optical critical dimension (OCD), atomic force metrology (AFM) and critical dimension-atomic force metrology (CD-AFM) can also be used for measuring the step heights. Similar equipment can also be used for after-development-inspection (ADI) and after-etching-inspection (AEI). The determination unit determines the over-etching time and trimming time using the step height data, ADI data, and AEI data. In one embodiment, the determination unit can be integrated with the device dimension measuring system. In other embodiments, the determination unit can be integrated with the gate etching equipment. In yet other embodiments, the determination unit is a separate unit. Gate etching (block 32) can be performed by equipment such as a fabrication (fab) operation system, a metrology tool, or an advanced process control (APC) system.

In one preferred embodiment, step 28 is performed before the steps of 30 and 33, as shown in FIG. 8. In other preferred embodiments, step 28 can be combined into step 32. This is because SCD equipment has the ability to measure STI step heights through gate poly film and photo resist/mask layer, and thus step heights can be measured after the formation of the photo resist/mask layers, preferably in the same environment as the gate etching. The measured STI step heights are then immediately used for gate etching.

The critical dimension (CD) (typically measured at the middle height of a gate) and the profile of the photo resist (PR) and hard mask affect the gate critical dimension and gate profile. The effect of PR profile to the gate CD can also be measured by measuring PR profiles (when step heights are fixed), and then measuring respective gate critical dimensions after etching. A correlation between PR profiles and gate critical dimensions may be construed. By using this correlation, gate trimming time can be further adjusted and applied to the etching of coming wafers. Therefore, the effect of the STI step heights can also be compensated for by adjusting the critical dimension and the profile of the photo resist and/or hard mask, as is illustrated by arrow 36 in FIG. 8.

The critical dimension of the photo resist and/or hard mask is partially determined by trimming time, during which the photo resist and hard mask are etched. Various parameters may be used to determine an optimal trimming time, and the parameters include the critical dimension and the profile of the photo resist and/or hard mask measured by after-development-inspection (ADI), the STI step height, etc. An exemplary workflow of determining the optimal trimming time is as following: initially, an estimated trimming time is provided to the photo development system, the determination unit then dynamically adjusts trimming time. When determining trimming time, the determination unit takes into account the photo resist (and/or hard mask) critical dimension and profile (arrow 48 in FIG. 8). If the critical dimension of the photo resist measured in ADI is greater than desired, trimming time is increased. Conversely, if the critical dimension of the photo resist measured in ADI is less than desired, trimming time is decreased.

The determination unit also takes STI height into account. As discussed above, when over-etching time is increased, all portions of the gate are etched with the bottom portion of the gate etched more than the top portion. The gate critical dimension, often measured at the middle height of the gate, is thus smaller. Therefore, both the trimming time and the over-etching time affect gate critical dimension, and the determination unit preferably takes the over-etching time into consideration when calculating the trimming time. For example, if STI height increases over the previous wafer, more over-etching time is needed, which causes the gate critical dimension to be smaller, thus less trimming time will be used so that the photo resist critical dimension is greater. A greater photo resist critical dimension will increase the gate critical dimension so that the effect of the greater STI height is compensated for.

Arrow 38 symbolizes the fine tuning of the gate formation control system using the gate critical dimension and profile found through after-etching-inspection (AEI) (block 34). If the measured gate critical dimension and profile in AEI step 34 deviates from desired values, the deviations may be used to adjust the determination of the over-etching time. Although in the preferred embodiment, the correlation between the step heights of STIs and over-etching time is typically pre-measured and construed, the correlation may be dynamically construed by using data collected at blocks 28 (step height), 32 (etching time) and 34 (AEI). For example, when a first wafer with step height $H_1$ is manufactured, a default over-etching time $T_1$ is used. In the AEI step 34, a gate profile $G_1$ is obtained by measuring the first wafer. $G_1$ and $T_1$ form a point in FIG. 6, and $G_1$ and $H_1$ form a point in FIG. 7. If $G_1$ is positive, when the second wafer having a same step height $H_1$ is processed, an over-etching time $T_2$, which is less than $T_1$ is used, otherwise $T_2$ is greater than $T_1$. The second wafer will have a second gate profile $G_2$. Similarly, $G_2$ and $T_2$ form a point in FIG. 6, and $G_2$ and $H_2$ form a point in FIG. 7. After an adequate number of samples are measured, the correlation between the gate profile and the over-etching time and the STI step height, such as shown in FIGS. 6 and 7 respectively, can be determined, and the correlation can be used for subsequent device formation. Another advantage of the preferred embodiment of the present invention is that gate profile errors caused by other factors may also be corrected by the AEI fine-tuning, even if the mechanisms of those factors are not known to the designers, providing the effects of those factors are not random and persist from wafer to wafer.

Figure 9:
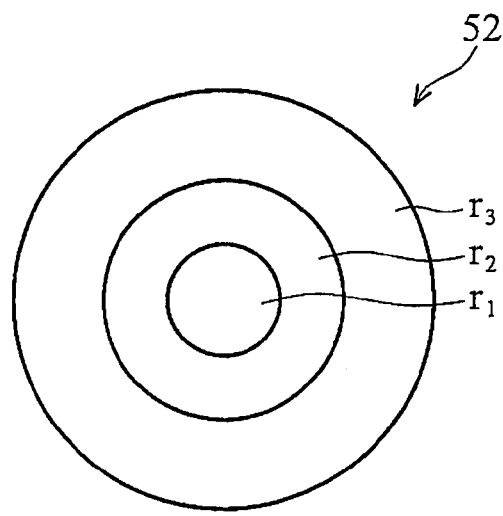
FIG. 9 illustrates a schematic view of within-wafer non-uniformity on a wafer.

Previously discussed embodiments target problems of wafer-to-wafer process variations. Other variations may cause non-uniformity within a wafer. FIG. 9 illustrates a schematic view of a wafer 52 wherein the STI step heights have within-wafer (WIW) non-uniformity. In a typical case, from the center of the wafer 52 to the outer edge, the chips having equal distances to the center have similar STI step heights. Therefore, rings such as $r_1$, $r_2$, and $r_3$ can be used to symbolize different STI step heights. For example, chips in $r_1$ have greater STI step heights than chips in $r_2$, and chips in $r_2$ have greater STI step heights than chips in $r_3$. The within-wafer non-uniformity of STI step heights will cause within-wafer non-uniformity of the gate critical dimensions and gate profiles. Preferably, within-wafer non-uniformity is also measured using similar equipment for measuring STI step heights, such as SCD and the like.

Figure 10A:
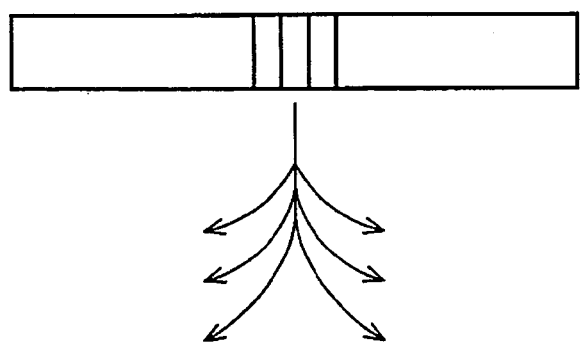
FIGS. 10A and 10B illustrate a method of improving within-wafer uniformity by using tunable gas injection.
Figure 10B:
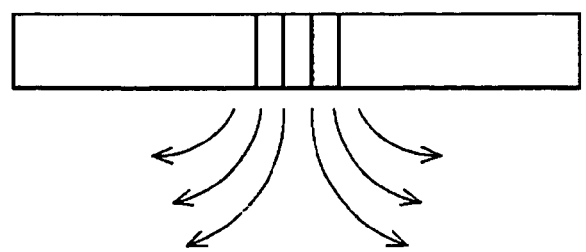

FIGS. 10A and 10B illustrate a method of improving within-wafer uniformity by using tunable gas injection. For dry etching, the etching rate is affected by the flow of etching gases. Since the etching gases are typically symmetrically injected into the reaction chamber, the etching rate on a wafer can also be illustrated as a ring-like structure, as shown in FIG. 9, with each ring having a similar etching rate. The etching gases can be injected into the chamber in center mode or edge mode. In the center mode, as illustrated in FIG. 10A, gases are injected into the reaction chamber mainly from a central point, preferably toward the center of the wafer. The chips closer and/or facing the center thus will have higher etching rates, while other chips will have lower etching rates. In the edge mode, as illustrated in FIG. 10B, gases are injected into the reaction chamber from more distributed locations that are away from the center. When switched from center mode to edge mode, the etching rate at the center of the chip decreases, and the etching rate at the edge of the chip increases.

Therefore, if after-development-inspection has revealed that there exists within-wafer non-uniformity of STI step heights, tunable gas injection is preferably used. In the preferred embodiment, depending on the difference of STI step heights at the center and at the edge, an appropriate gas injection mode, which is either the center mode or edge mode, is adopted. In a more preferred embodiment, a combination of center mode and edge mode, in which etching gases are injected into the chamber from both the center and the distributed locations simultaneously, can be used. For example, if the STI heights at the center are greater than at the edge, the profile at the center will have greater footing effect than at the edge. Therefore, more centered gas injection is preferred. This will cause gate footing effect reduced more at the center of the wafer than at the edge, and thus form a wafer with more uniform gate profiles. Conversely, if the STI step heights at the center are lower than at the edge, edge mode is preferably adopted. The tunable gas injection mode may be used for both photo resist development and gate etching.

It is to be realized that although a polysilicon gate is used for the description purpose, the method and system are readily available to the profile control of gates having other materials. Also, the correlation between the gate profile and respective STI step height and over-etching times are exemplary data and thus may change for different processes and materials. One skilled in the art can find the correlation between those materials and the STI step height through experiments, making corresponding data correlations and providing the data into the gate formation control system.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of controlling gate formation of a semiconductor device, the method comprising:
measuring step heights between an isolation dielectric and an adjacent active region on wafers;
over-etching gates on the wafers and recording respective over-etching times;
measuring gate profiles of the gates, wherein the gate profiles are determined by measuring a difference between first widths of lower portions of the gates and respective second widths of upper portions of the gates;
determining a correlation between step heights and over-etching time using the step heights, the over-etching times, and the gate profiles;
measuring a step height of the semiconductor device on a target wafer;
determining an over-etching time based on the correlation and the step height of the semiconductor device on the target wafer; and
over-etching a target gate of the semiconductor device on the target wafer by feed forwarding the determined over-etching time.

2. The method of claim 1 wherein a gate electrode comprises polysilicon.

3. The method of claim 1 further comprising:
measuring the target gate profile after the etching the target gate; and
feeding back the target gate profile to the determining the over-etching time step.

4. The method of claim 1 further comprising determining a trimming time of a mask layer using the step height of the semiconductor device on the target wafer, wherein the mask layer is trimmed from a top and sides and wherein the mask layer is used for the over-etching the target gate of the semiconductor device on the target wafer.

5. The method of claim 4 further comprising:
performing an after-development-inspection of the mask layer to determine a critical dimension and a profile of the mask layer; and
feeding the critical dimension and the profile to the determining the trimming time step for over-etching a target gate of a next semiconductor device.

6. A method of controlling gate formation of a semiconductor device, the method comprising:
measuring a step height of a target wafer; and determining a trimming time of a mask layer using the step height, wherein the mask layer is trimmed from a top and sides and wherein the mask layer is used for an over-etching a target gate of the semiconductor device of the target wafer.

7. The method of claim 6 further comprising:
measuring a critical dimension and measuring a profile of the mask layer in an after-development-inspection, wherein the profile of the mask layer is a relative width difference between a first width of a lower portion of the mask layer and a second width of an upper portion of the mask layer; and
feeding the critical dimension and the profile to the determining the trimming time step.

8. A method of controlling gate formation of a semiconductor device, the method comprising:
measuring a first step height of a first location and a second step height of a second location on a wafer;
determining non-uniformity of the wafer using the first and the second step heights; and
determining a gas injection mode for etching gates of MOS devices on the wafer that will substantially compensate for the non-uniformity of the wafer using the determined non-uniformity.

9. A method of forming a semiconductor device comprising:
consigning to a determination unit an optimized over-etch time for each of a plurality of step heights;
providing a step height, for a target wafer, to the determination unit, wherein the step height is obtained by measuring the step height between an isolation dielectric and an adjacent active region on the semiconductor device of the target wafer; and
performing an over-etch process on a gate structure of the semiconductor device of the target wafer, wherein an over-etch time is fed forward to the over-etch process by the determination unit.

10. The method of claim 9, wherein the optimized over-etch time is pre-determined by a process comprising:
storing a first step height measured on a first wafer;
etching a first gate structure on the first wafer using a first over-etch time;
determining and storing a first gate profile wherein the first gate profile is determined by measuring a difference between first widths of lower portions of the first gate structure and respective second widths of upper portions of the first gate structure;
storing a second step height measured on a second wafer;
etching a second gate structure on the second wafer using a second over-etch time;
measuring and storing a second gate profile wherein the second gate profile is determined by measuring a difference between first widths of lower portions of the second gate structure and respective second widths of upper portions of the second gate structure; and
construing an optimized plurality of over-etch times by predetermining a correlation between step height, over-etch time, and gate profile using the first gate profile, the second gate profile, the first over-etch time, the second over-etch time, the first step height and the second step height.

11. The method of claim 9, wherein the isolation dielectric is disposed in a shallow trench isolation (STI) structure.

12. The method of claim 9, wherein the gate structure comprises a polysilicon electrode.

13. The method of claim 9, wherein the step height is obtained by spectra critical dimension equipment.

14. The method of claim 9 further comprising:
performing an etch process on the gate structure prior to performing an over-etch process on the gate structure.

15. The method of claim 14, further comprising:
providing the determination unit with a gate profile of the gate structure following the etch process; and
dynamically selecting the over-etch time based on the gate profile provided.

16. The method of claim 9, further comprising:
forming a mask layer, wherein the mask layer is formed prior to performing the over-etch process;
implementing a trimming recipe, wherein the trimming recipe comprises a trim time; and
selecting the trim time based on the step height.

17. The method of claim 16, further comprising:
inspecting the mask layer following a development process to determine a critical dimension and a profile of the mask layer; and
providing the critical dimension and the profile of the mask layer to the determination unit to select the trim time.

18. The method of claim 9, further comprising:
providing a second step height, from a second location on the wafer, to the determination unit; and
determining a gas injection mode for the step of performing the over-etch process on the gate structure, based on a difference between the step height and the second step height.

19. The method of claim 9, wherein the determination unit consists of a unit selected from the group consisting of a unit integrated with a device dimension measuring system, a unit integrated with gate etching equipment, a separate fabrication operation system, a separate advanced process control (APC) system, or a combination thereof.

20. The method of claim 9 further comprising:
consigning to the determination unit an optimized trim time correlating to each of the plurality of step heights;
providing a second step height, for a second location on the wafer to the determination unit;
further providing a critical dimension of a mask layer;
executing a resist trim of the mask layer, wherein the determination unit provides the optimized trim time based on the step height and the critical dimension of the mask layer;
feeding back to the determination unit a post resist trim critical dimension of the mask layer and a post resist trim profile of the mask layer, wherein the determination unit, using the post resist trim critical dimension of the mask layer and the post resist trim profile of the mask layer, fine tunes the optimized trim time therein consigned;
determining a gas injection mode for the step of performing the over-etch process on the gate structure, based on a difference between the step height and the second step height; and
additionally feeding back to the determination unit a post etch gate profile, wherein the determination unit, using the post etch gate profile, fine tunes the optimized over-etch time therein consigned.

* * * * *